US011499229B2

(12) United States Patent
Ramalingam et al.

(10) Patent No.: US 11,499,229 B2
(45) Date of Patent: Nov. 15, 2022

(54) SUBSTRATE SUPPORTS INCLUDING METAL-CERAMIC INTERFACES

(71) Applicant: Applied Materials, Inc., Santa Clara, CA (US)

(72) Inventors: Chidambara A. Ramalingam, Fremont, CA (US); Juan Carlos Rocha, San Carlos, CA (US); Joseph M. Polese, Santa Clara, CA (US); Katty Marie Lydia Gamon Guyomard, Los Altos, CA (US); Jian Li, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 531 days.

(21) Appl. No.: 16/697,472

(22) Filed: Nov. 27, 2019

(65) Prior Publication Data

US 2020/0173017 A1 Jun. 4, 2020

Related U.S. Application Data

(60) Provisional application No. 62/775,177, filed on Dec. 4, 2018.

(51) Int. Cl.
*C23C 16/458* (2006.01)
*H01J 37/32* (2006.01)
*H01L 21/683* (2006.01)

(52) U.S. Cl.
CPC ...... *C23C 16/4581* (2013.01); *C23C 16/4586* (2013.01); *H01J 37/32724* (2013.01); *H01L 21/6833* (2013.01); *C23C 16/4585* (2013.01)

(58) Field of Classification Search
CPC .......... C23C 16/45565; C23C 16/4581; C23C 16/4585; C23C 16/4586
See application file for complete search history.

(56) References Cited

U.S. PATENT DOCUMENTS

| 5,478,429 A | 12/1995 | Komino et al. |
| 5,829,791 A | 11/1998 | Kotsubo et al. |

(Continued)

FOREIGN PATENT DOCUMENTS

| JP | H0697118 A | 4/1994 |
| JP | H11330058 A | 11/1999 |

(Continued)

OTHER PUBLICATIONS

PCT International Search Report and Written Opinion dated Mar. 17, 2020, for International Application No. PCT/US2019/063663.

(Continued)

*Primary Examiner* — Gary A Nash
(74) *Attorney, Agent, or Firm* — Patterson + Sheridan, LLP

(57) ABSTRACT

Embodiments of the present disclosure generally relate to substrate support assemblies used in semiconductor device manufacturing. In one embodiment, a substrate support includes a ceramic body having at least one aperture formed therein defined by a sidewall. A plurality of recesses extend into the sidewall, a rod member is disposed in the at least one aperture, and an eyelet member is circumferentially disposed about the rod member. The eyelet member has a plurality of protrusions extending outwardly therefrom, each disposed in a corresponding recess of the plurality of recesses. A first portion of each protrusion is in contact with a sidewall of the respective recess of the ceramic body and a second portion of each protrusion is separated by a gap from the sidewall of the respective recess of the ceramic body. A first portion of a brazing material is disposed between an upper surface of the at least one aperture and an end of the rod member.

20 Claims, 5 Drawing Sheets

(56) References Cited

U.S. PATENT DOCUMENTS

| | | |
|---|---|---|
| 5,995,357 A | 11/1999 | Ushikoshi et al. |
| 6,242,360 B1 | 6/2001 | Fischer et al. |
| 6,445,567 B1 | 9/2002 | Komatsuki et al. |
| 7,354,288 B2 | 4/2008 | Maehara et al. |
| 7,674,338 B2 * | 3/2010 | Guenther ............ C23C 16/4586 |
| | | 118/725 |
| 8,274,017 B2 | 9/2012 | Yap et al. |
| 8,287,689 B2 | 10/2012 | Sato |
| 8,334,481 B2 * | 12/2012 | Komatsu .......... H01L 21/67103 |
| | | 219/390 |
| 8,592,712 B2 | 11/2013 | Fujisato et al. |
| 9,520,276 B2 | 12/2016 | Takahashi et al. |
| 10,153,136 B2 | 12/2018 | Augustino et al. |
| 10,242,890 B2 * | 3/2019 | Volfovski ................ H05B 3/145 |
| 2003/0141820 A1 | 7/2003 | White et al. |
| 2005/0274324 A1 | 12/2005 | Takahashi et al. |
| 2009/0200268 A1 | 8/2009 | Tappan et al. |
| 2009/0242132 A1 | 10/2009 | Sato |
| 2009/0314208 A1 | 12/2009 | Zhou et al. |
| 2010/0282603 A1 * | 11/2010 | Sterling .............. C23C 16/4586 |
| | | 204/298.31 |
| 2011/0024047 A1 * | 2/2011 | Nguyen .............. H01L 21/6875 |
| | | 118/723 R |
| 2011/0126765 A1 | 6/2011 | Yamazawa et al. |
| 2012/0326592 A1 | 12/2012 | Kudela et al. |
| 2013/0126206 A1 | 5/2013 | Zhou et al. |
| 2013/0221833 A1 | 8/2013 | Kudela et al. |
| 2015/0243483 A1 | 8/2015 | Chen et al. |
| 2016/0035610 A1 * | 2/2016 | Park .................... H01L 21/6833 |
| | | 165/80.2 |
| 2018/0204747 A1 * | 7/2018 | Knyazik .................. C09K 5/14 |
| 2019/0071778 A1 | 3/2019 | Thomas et al. |

FOREIGN PATENT DOCUMENTS

| | | |
|---|---|---|
| JP | 2003204156 A | 7/2003 |
| JP | 2008198975 A | 8/2008 |
| JP | 2010103321 A | 5/2010 |
| KR | 100933430 B1 | 12/2009 |
| KR | 101763713 B1 | 8/2017 |
| KR | 20190117931 A | 10/2019 |
| KR | 20190117934 A | 10/2019 |
| TW | 201001592 A | 1/2010 |
| TW | 201614708 A | 4/2016 |
| TW | 201804564 A | 2/2018 |
| WO | 2010030101 A2 | 3/2010 |

OTHER PUBLICATIONS

Taiwan Office Action dated Sep. 17, 2020, for Taiwan Patent Application No. 108144062.

* cited by examiner

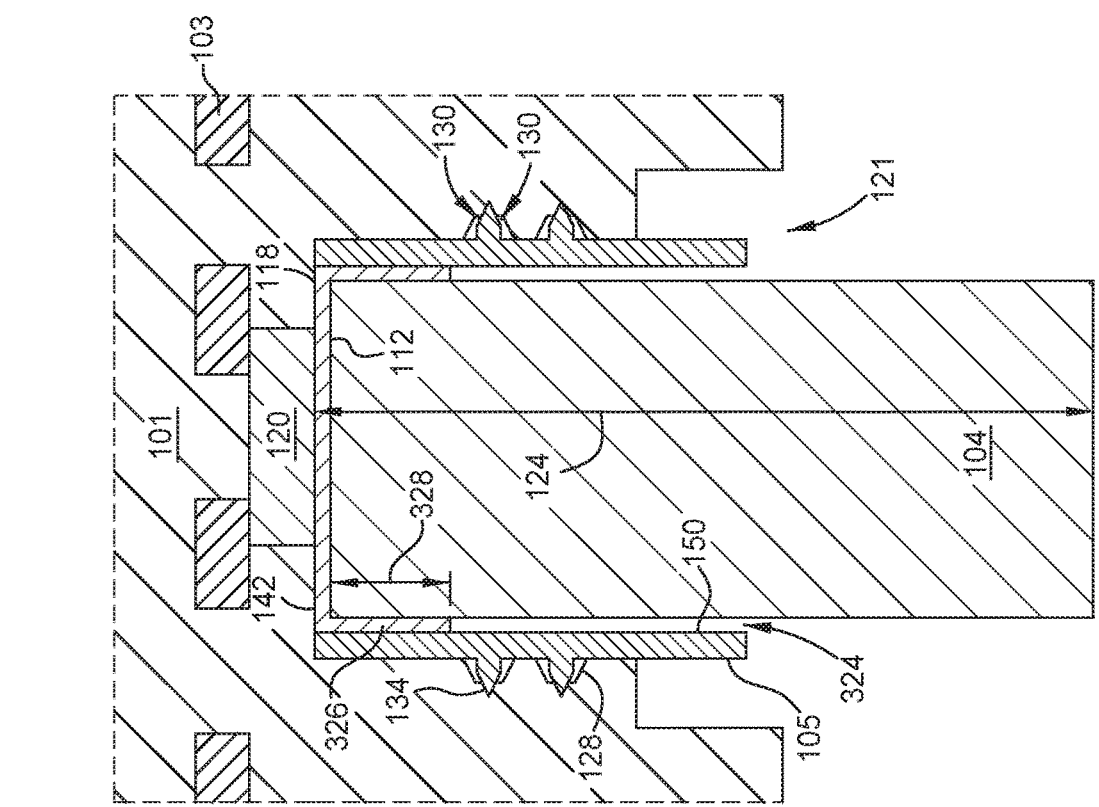
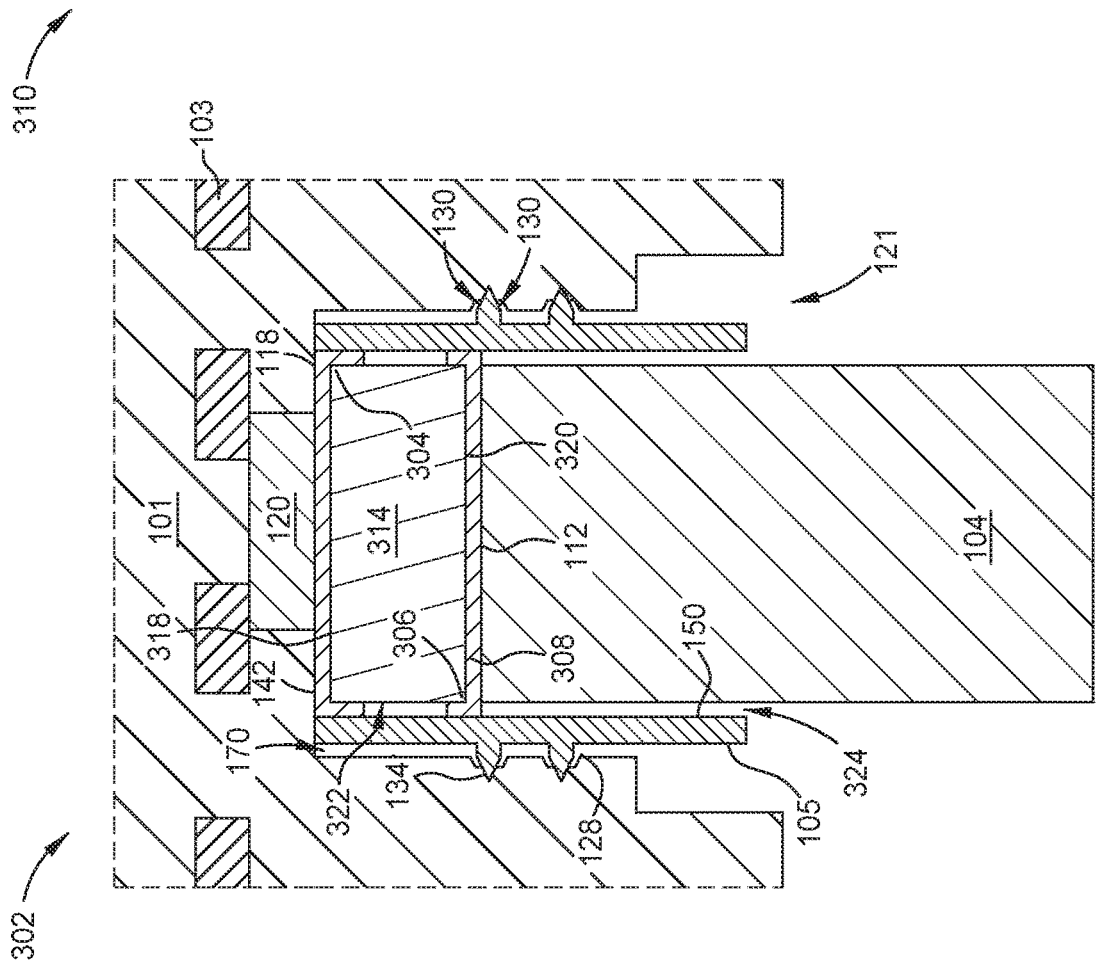

SUBSTRATE SUPPORTS INCLUDING METAL-CERAMIC INTERFACES

CROSS-REFERENCE TO RELATED APPLICATIONS

This application claims priority to U.S. Provisional Patent Application Ser. No. 62/775,177, filed on Dec. 4, 2018, which is incorporated by reference herein.

BACKGROUND

Field

Embodiments of the present disclosure generally relate to substrate support assemblies used in semiconductor device manufacturing.

Description of the Related Art

Substrate supports are commonly used in semiconductor device manufacturing to support a substrate within a processing chamber during processing of the substrate. Often, substrate supports are configured to secure the substrate to a surface of the substrate support by providing an electrostatic chucking force between the substrate and an electrode embedded in a dielectric ceramic material used to form the substrate support. In some embodiments, substrate supports are further configured to provide a bias voltage to the substrate by capacitive coupling the same, or a different, embedded electrode therewith.

For some substrate processing operations, a substrate support may be used to heat the substrate to, and maintain the substrate at, a desired processing temperature by heating the ceramic material of the substrate support and thus a substrate disposed thereon. The ceramic material of the substrate support is typically heated using a heater, such as one or more resistive heating elements, embedded in the ceramic body and/or otherwise in thermal communication therewith. Thus, a substrate support will often comprise a multitude of components formed from different materials having different thermal, mechanical, and/or electrical properties. Examples of these components include the ceramic body, the electrode(s) embedded in the ceramic body, heating elements embedded in the ceramic body, and electrical connectors used to couple the electrode(s) and or heating elements to respective power supplies that deliver power thereto.

Unfortunately, mismatch of material properties between different components of the substrate support may cause one or more components of the substrate support to expand and push against other components when the substrate support is heated. When the substrate support is allowed to cool, such as between substrate processing and/or during routine maintenance procedures, the same components may contract and pull away from adjacent components causing undesirable damage at the interfaces thereof.

Thus, there remains a need for an improved substrate support assembly for high temperature operations.

SUMMARY

The present disclosure generally relates to substrate supports used in semiconductor device manufacturing. In one embodiment, a substrate support includes a ceramic body and an electrode embedded in the ceramic body. The ceramic body feature an aperture formed therein that facilitates electrical coupling of the electrode to a power supply external to the substrate support. The aperture is defined by a sidewall having a plurality of recesses extending thereinto. A rod member is disposed in the aperture, and an eyelet member is circumferentially disposed about the rod member. The eyelet member features a plurality of protrusions extending radially outward therefrom. Each protrusion of the plurality of protrusions is disposed in a corresponding recess of the plurality of recesses formed in the sidewall of the aperture. A first portion of each protrusion of the plurality of protrusions is in contact with a surface of the ceramic body and a second portion of each protrusion is separated from the ceramic body by a gap disposed there between.

In another embodiment, a substrate support includes a ceramic body having at least one aperture formed therein. The aperture is defined by a sidewall and a plurality of recesses extend into the sidewall. A rod member is disposed in the aperture and an eyelet is member circumferentially disposed about the rod member. The eyelet member is formed from metal foam and has a plurality of protrusions extending radially outward therefrom. Each protrusion of the plurality of protrusions is disposed in a corresponding recess of the plurality of recesses. A first portion of each protrusion of the plurality of protrusions is in contact with the the ceramic body and a second portion of each protrusion spaced apart from the ceramic body by a gap disposed therebetween. A brazing material is disposed between a base of the aperture and an end of the rod member.

In another embodiment, a substrate support includes a ceramic body having an aperture formed therein. The aperture is defined by a sidewall having a plurality of recesses formed therein. A rod is member is disposed in the aperture and an eyelet member is circumferentially disposed about the rod member. The eyelet member has a plurality of protrusions that extend radially outward therefrom. Each protrusion of the plurality of protrusions is disposed in a corresponding recess of the plurality of recesses. A first portion of each protrusion of the plurality of protrusions is in contact with one or more surfaces of the respective recess and a second portion of each protrusion is spaced apart from the one or more surfaces of the respective recesses by a gap disposed therebetween. A first portion of a brazing material is disposed in between a base of the aperture and an end of the rod member and a second portion of the brazing material extends from the first portion of brazing material along a length of the rod member.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 3A-3C are enlarged sectional views schematically illustrating a portion of a substrate support which may be used in place of the substrate support set forth in FIG. 1A, according to another embodiment.

To facilitate understanding, identical reference numerals have been used, where possible, to designate identical elements that are common to the Figures. It is contemplated that elements and features of one embodiment may be beneficially incorporated in other embodiments without further recitation.

DETAILED DESCRIPTION

Embodiments of the present disclosure generally relate to substrate support assemblies used in semiconductor device manufacturing and, more particularly, to metal-ceramic interfaces within the substrate support. The substrate supports provided herein include metal and ceramic components coupled together in various configurations that reduce and/or substantially eliminate damage to the ceramic body and/or failure of electrical connections within the substrate support caused by repeated heating and cooling cycles.

In some embodiments, one or more metal-ceramic interfaces within the substrate feature a plurality of gaps that allow for the expansion of a metal component when the substrate support is heated to at temperatures up to about 650° C. or more. Beneficially, these expansion gaps allow for relative movement between a metal component and the ceramic body without damaging the ceramic surfaces at interfacial regions therebetween. The gaps can be formed between mating features of metal members and the ceramic body in various positions in the substrate support. The gaps can be formed via the geometries of, for example, protrusions on a metal part and recesses (troughs) on a ceramic part that accept some or all of the protrusions. In some embodiments, one or more of the metal components are formed from a metal foam. The metal foam typically comprises a base metal formed to have an open or closed cellular structure having voids or pores disposed therebetween. When the metal foam is heated, the expansion of the base material may be absorbed into the void or pore regions thus lowering the force exerted by the component on the ceramic surfaces of the substrate support disposed adjacent thereto. Examples of suitable base materials for the metallic foams used herein metal or metal alloy such as nickel (Ni) or nickel-based alloys. In some embodiments, the metal or metal alloy of the metal foam comprises less than about 30% of the volume of the structure formed thereof, such as between about 5% and about 25%, i.e., the metal foam has a porosity of more than about 70%, such as between about 75% and about 95%. In still other embodiments, brazing material that is used to promote coupling of the metal members and ceramic body is configured to allow for expansion of the metal member(s) in one or more directions without damaging the surfaces of the ceramic body disposed adjacent thereto.

Figure 1A:
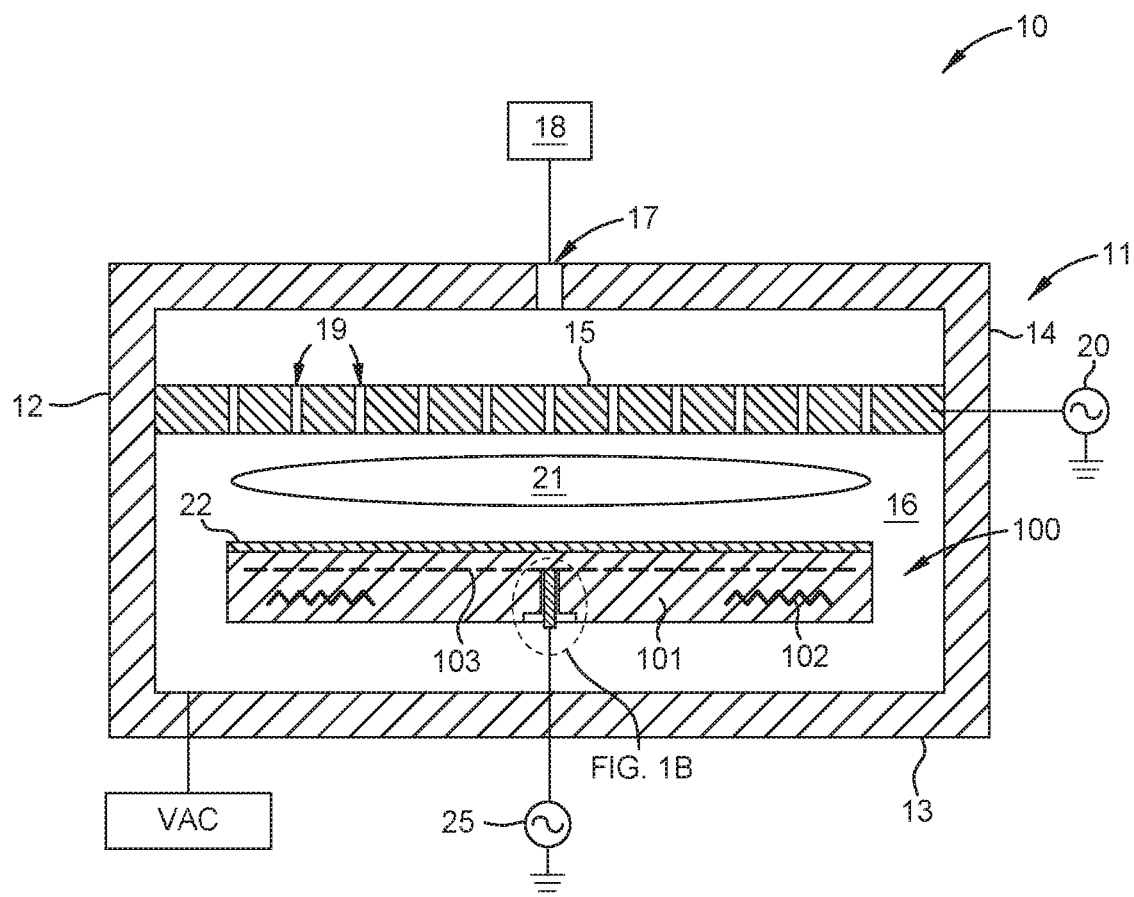
FIG. 1A is a schematic cross sectional view of an exemplary processing chamber that features a substrate support formed according to embodiments described herein.

FIG. 1A is a schematic cross sectional view of an exemplary processing chamber 10 that features a substrate support 100 formed according to embodiments described herein. Here, the processing chamber 10 is a configured for a plasma enhanced material deposition process, e.g., plasma enhanced chemical vapor deposition (PECVD) or atomic layer deposition (PEALD). However, it is contemplated that embodiments of the substrate supports described herein can be used with other processing chambers where a substrate support suitable for relativity high temperature processing is desired.

The processing chamber 10 includes a chamber lid assembly 11, one or more sidewalls 12, and a chamber base 13. The chamber lid assembly 11 includes a chamber lid 14 having a showerhead 15 disposed therein where the showerhead 15, the one or more sidewalls 12, and the chamber base 13 collectively define a processing volume 16. A gas inlet 17, disposed through the chamber lid 14 is fluidly coupled to a gas source 18. The showerhead 15, having a plurality of openings 19 disposed there through, is used to uniformly distribute processing gases from the gas source 18 into the processing volume 16. Here, the showerhead 15 is electrically coupled to a first power supply 20, such as an RF power supply, which supplies power to ignite and maintain a plasma 21 of the processing gas through capacitive coupling. In other embodiments, the processing chamber 10 comprises an inductive plasma generator and the plasma is formed through inductively coupling of an RF power to the processing gas. The processing volume 16 is fluidly coupled to a vacuum source, such as to one or more dedicated vacuum pumps, which maintains the processing volume 16 at sub-atmospheric conditions and evacuates the processing gas and other gases from the processing volume 16.

During processing, a substrate 22 is transferred to and from the processing volume 16 through a door or a valve (not shown) disposed in one of the one or more sidewalls 12 of the processing chamber 10. During processing, the substrate 22 is typically disposed on and secured to the substrate support 100 disposed in the processing volume 16. In some embodiments, the substrate support 100 is disposed on a movable support shaft (not shown) that is sealingly disposed through the chamber base 13, such as being surrounded by a bellows (not shown) surrounding the support shaft in a region below the chamber base 13. The substrate support 100 is typically formed of a ceramic body 101 and herein includes a heater, such as the resistive heating element 102, embedded in the ceramic body 101 or otherwise in thermal communication therewith. The heater is used to heat the substrate 22 disposed on the substrate support 100 and to maintain the substrate 22 at a desired temperature during processing thereof. In some embodiments which can be combined with other embodiments, the substrate 22, and thus the substrate support 100, is heated to temperatures of 500° C. or more, such as about 550° C. or more, 600° C. or more, for example 650° C. or more during substrate processing.

In embodiments herein, the substrate support 100 further includes one or more electrodes, such as electrode 103, embedded in the ceramic body 101. The one or more electrodes may be used to electrostatically chuck a substrate 22 to a surface of the substrate support 100. The one or more electrodes may be formed of any suitable electrically conductive material such as electrically conductive and/or metal meshes, foils, plates, wires, nanoparticles, or combinations thereof. Typically, a chucking and/or bias power is delivered to the one or more electrodes 103 from a corresponding power supply, such as the second power supply 25, electrically coupled to the electrodes 103. The chucking and/or bias power is provided to the one or more electrodes 103 using a corresponding conductive metal rod, such as the rod member 104 (shown in FIG. 1B).

Figure 1B:
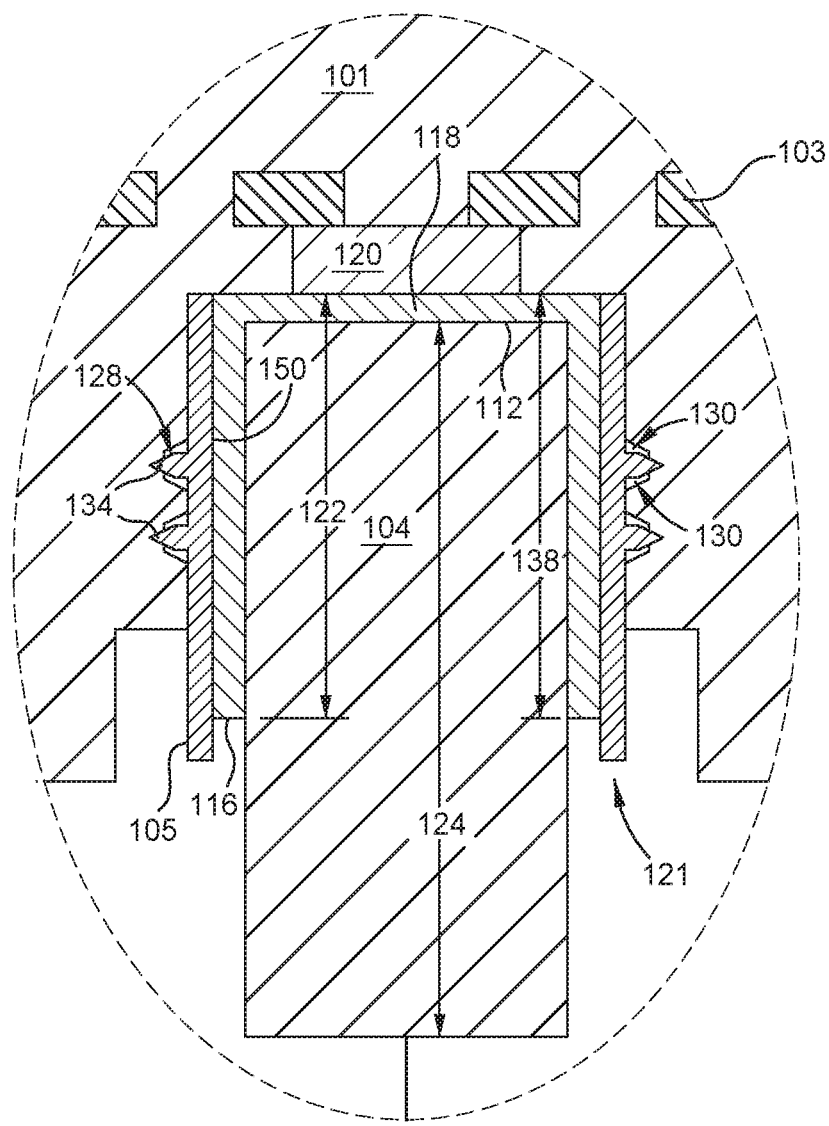
FIG. 1B is an enlarged sectional view of a portion of the substrate support of FIG. 1A, according to one embodiment.

FIG. 1B is an enlarged view of a portion of the substrate support 100 shown in FIG. 1A. Here, the rod member 104 comprises a cylindrical metal rod having an upper surface, i.e., an end, electrically coupled to the electrode 103 using a terminal member 120 disposed therebetween. In some embodiments, the rod member 104 has a diameter of between about 1 mm and about 10 mm, such as between about 2 mm and about 8 mm, or between about 3 mm and about 7 mm. The terminal member 120 is typically embedded in the ceramic body 101 and is disposed in electrical communication and/or direct contact with the electrode 103. The rod member 104 is formed of a suitable conductive material for transmitting RF or AC power to the electrode 103. Examples of suitable materials for the rod member include nickel and alloys thereof. Examples of suitable materials for the electrode 103 and the terminal member 120 include molybdenum and alloys thereof.

The embedded terminal member 120 is disposed at a base of an aperture 121 formed in the ceramic body 101. The aperture 121 is disposed in a second surface of the ceramic body 101 that is opposite of a first surface which supports a substrate 22 thereon. The rod member 104 is secured to the ceramic body 101, e.g., to the sidewalls of the aperture 121, to prevent any relative movement between the rod member 104 and the terminal member 120 that may cause the undesirable failure of the electrical connection there between. Here, the rod member 104 is secured to the ceramic body 101 using an eyelet member 105.

Here, an upper surface 112 of the rod member 104 is electrically coupled to the terminal member 120 using a brazing material such as gold, nickel, or alloys and/or combinations thereof. For example, as shown in FIG. 1B, a first brazing material portion 118 is disposed in between the upper surface 112 of the rod member 104 and the base of the at least one aperture 121. The material(s) used to form the first brazing material portion 118 can be selected to have a coefficient of thermal expansion and/or or other material properties that are similar to the corresponding properties of the rod member 104. The first brazing material portion 118 is further in contact with portions of the ceramic body 101 adjacent to the terminal member 120 at the base of the aperture 121. In some embodiments, the first brazing material portion 118 is selected to have a coefficient of thermal expansion or other material properties that are substantially similar to the corresponding material properties of the terminal member 120. In some embodiments, a difference between the coefficient of thermal expansion for the brazing material and the coefficient of thermal expansion of the material used for the terminal member 120 is 20% or less, such as 15% or less, 10% or less, or 5% or less, or 3% or less, or 1% or less.

Here, the eyelet member 105 is circumferentially disposed about the rod member 104 and is thus disposed between the rod member 104 and the ceramic body 101. The eyelet member 105 has a length 138 which can be less than the rod member height 124. In one example, the length 138 of the eyelet member 105 is from 5%-80% of the rod member height 124. The eyelet member 105 further secures the rod member 104 to the ceramic body 101 using a plurality of protrusions 134. The plurality of protrusions 134 extend outward from the eyelet member 105. In one example, the plurality of protrusions 134 can be configured as a continuous or discontinuous male thread that extends circumferentially around an outside surface of the eyelet member 105 one or more times. In another example, the plurality of protrusions 134 can be configured as individual protrusions of varying or similar shapes and sizes. The eyelet member 105 can be formed from a metal or metal alloy such as nickel, or from metal foam (e.g., porous metal). In one example, the eyelet member 105 and the rod member 104 are formed from the same metal or from alloys of the same metal. The first brazing material portion 118 extends along the upper surface 112 of the rod member 104 and is in contact with an inward facing surface 150 of the eyelet member 105. Thus, the first brazing material portion 118 further secures the rod member 104 to the eyelet member 105 and the ceramic body 101.

In an embodiment, each protrusion 134 of the eyelet member 105 is received by a corresponding recess 128 of the plurality of recesses 128 of the ceramic body 101 to secure the eyelet member 105 to the ceramic body 101 when the rod member 104 is disposed in the aperture 121. When the eyelet member 105 is coupled to the ceramic body 101, a gap 130 is formed between each protrusion 134 and its corresponding recess 128. Thus, a first portion of each protrusion 134 is in direct contact with a corresponding recess 128, and a second portion of each protrusion 134 is separated (spaced apart) from the corresponding recess 128. The gap 130 allows the eyelet member 105 to expand, accounting for the differences in the coefficients of thermal expansion between at least the eyelet member 105 and the ceramic body 101. This enables the expansion of the eyelet member 105 when the substrate support 100 is at an elevated temperature so that the eyelet member 105 does not destructively impinge on the ceramic body 101.

The plurality of protrusions 134, and, thus, the plurality of recesses 128, can have various cross-sectional geometries such as triangles, triangles with rectangular bases, polygons, circles or ellipses, or combinations thereof. The plurality of protrusions 134 and the plurality of recesses 128 are configured to be positioned relative to one another to form gaps 130 there between as discussed below.

In some embodiments, the first brazing material portion 118 is the only brazing material used to couple the rod member 104 to the ceramic body 101 and to couple the eyelet member 105 to the ceramic body 101 and the rod member 104. In another example, as shown in FIG. 1B, a second brazing material portion 116 extends from the first brazing material portion 118 along the outward facing surface (circumferential surface) of the rod member 104 for a predetermined length 122 between the rod member 104 and the eyelet member 105. Thus, it is contemplated that the second brazing material portion 116 is optional. The material(s) used to form the second brazing material portion 116 can be selected to have a coefficient of thermal expansion and/or or other material properties that are similar to the corresponding properties of the eyelet member 105 and/or the rod member 104. Depending upon the embodiment, the predetermined length 122 of the second brazing material portion 116 can be equal to or less than the length 138 of the eyelet member 105. The configurations of brazing material are discussed in detail below. The second brazing material portion 116 can be configured to create gaps (shown and discussed below in FIGS. 3A-3C) in the substrate support 100 to allow the rod member 104 and the eyelet member 105 to expand and contract without damaging the ceramic body 101.

In some examples, the eyelet member 105 and the rod member 104 are formed from the same material or from different alloys or compositions of the same element or elements so that each has a similar coefficient of thermal expansion. In some embodiments, a difference between embodiment the coefficient of thermal expansion of the material used to form the eyelet member 105 and the coefficient of thermal expansion of the material used to form the rod member 104 is 20% or less, such as 15% or less, 10% or less, or 5% or less, or 3% or less, or 1% or less.

While the ceramic body 101 is shown as a solid structure in FIG. 1B, it is contemplated that, in other embodiments, the ceramic body 101 includes voids, gaps, apertures, recesses, or other features. In some embodiments, the heating element (shown in FIG. 1B) may be electrically coupled to a power source (not shown) using one or a combination of a rod member, an eyelet, a brazing material, and a terminal member as shown and described in any of the FIG. 1B, 2A-2C, or 3A-3C set forth herein.

Beneficially, the substrate support 100 set forth in FIGS. 1A-1B may be used in any process chamber that is configured to perform film formation, patterning, annealing, or other operations and configured to maintain structural integrity at operating temperatures on the order of 650° C. because the metal components have space to expand and contract in the gaps 130. Additional space for expansion of metal components can be included in substrate supports as discussed below.

Figure 2A:
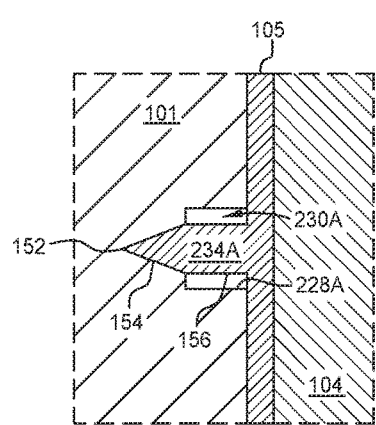
FIGS. 2A-2C are enlarged sectional views schematically illustrating a portion of a substrate support which may be used in place of the substrate support set forth in FIG. 1A, according to another embodiment.
Figure 2B:
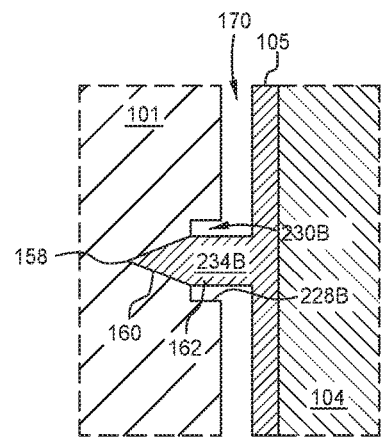
Figure 2C:
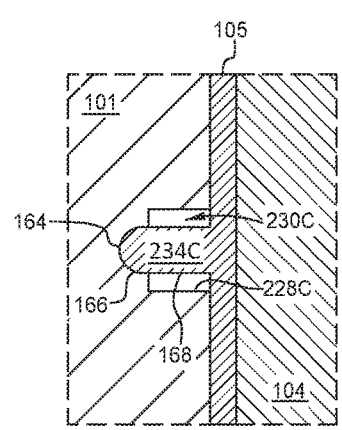

FIGS. 2A-2C are enlarged sectional views a substrate support, according to another embodiment, that may be used in place of the substrate support 100 described in FIGS. 1A-1B. FIGS. 2A-2C show the eyelet member 105 coupled to the rod member 104 and the ceramic body 101. In particular, FIGS. 2A-2C show the gaps 230A-230C in protrusion-recess couplings that can be used to compensate for differences in coefficients of thermal expansion between metal components (e.g., the rod member 104 and the eyelet member 105) and the ceramic body 101. In some embodiments, at least a portion of a protrusion 234A-C is spaced apart from a surface of the corresponding recess 228A-C by a gap width of about 1 μm or more, such as about 5 μm or more, 10 μm or more, 20 μm or more, 50 μm or more, 100 μm or more, 150 μm or more, 200 μm or more, 300 μm or more, 400 μm or more, or 500 μm or more.

In some embodiments, a male thread forming the plurality of protrusions 234A-C is weakened with respect to a female thread forming the corresponding plurality of recesses 228A-C to allow for flex movement and longitudinal thermal expansion of the eyelet member 105 relative to the ceramic body 101. In those embodiments, an angle formed by one or more surfaces of the recesses 228A-C (e.g., the triangular cross-section) is greater than an angle formed by the surfaces of the corresponding protrusion 234A (e.g., the triangular cross section of portion 154) to be inserted and/or threaded thereinto, such greater than 5° or more, 10° or more, 15° or more, 20° or more, 25° or more, or greater than 30° or more. FIG. 2A shows the ceramic body 101, the eyelet member 105, and a protrusion 234A disposed in a recess 228A of the ceramic body 101. A portion of the rod member 104 is also shown in FIG. 2A for reference. The protrusion 234A includes a tip 152, a first portion 154, and a second portion 156. The first portion 154 of the protrusion 234A has a triangular cross-section and the second portion 156 of the protrusion 234A has a polygonal cross section. The first portion 154 of the protrusion 234A is in direct contact with the ceramic body 101. The second portion 156 of the protrusion 234A is spaced away from (not in contact with) the ceramic body 101, via a gap 230A which surrounds the second portion 156. Thus, in the illustrated example, radial outward portions of the protrusion 234A are in contact with the ceramic body 101, while radially inward portions of the protrusion 234A are spaced apart from the ceramic body 101.

While the gap 230A is shown as evenly spaced between the protrusion 234A and the ceramic body 101, it is contemplated that the gap 230A can have various dimensions that result in a non-uniform spacing between the protrusion 234A and the ceramic body 101. For example, the gap 230A can have a tapered, bowed, or other cross-sectional shape. The gap 230A is configured to allow for the expansion of the eyelet member 105 during substrate support heating since the eyelet member 105 and the ceramic body 101 can expand and contract at different rates due to differences in material properties. In some examples, the first portion 154 of the protrusion 234A that is in direct contact with the ceramic body 101 includes 10%-70% of a surface area of the protrusion 234A. In other examples, the first portion 154 includes 30%-50% of the surface area of the protrusion 234A.

FIG. 2B shows the ceramic body 101, the eyelet member 105, and a protrusion 234B disposed in a recess 228B of the ceramic body 101. A portion of the rod member 104 is also shown in FIG. 2B for reference. The protrusion 234B includes a tip 158, a first portion 160, and a second portion 162. The first portion 160 is shown to have a triangular cross-section and the second portion 162 is shown to have a polygonal cross section. The first portion 160 of the protrusion 234B is in direct contact with the ceramic body 101. The second portion 162 of the protrusion 234B is spaced away from (not in contact with) the ceramic body 101 via a gap 230B. While the gap 230B is shown as uniform in distance between the protrusion 234B and the recess 228B, it is contemplated that the gap 230B can have various dimensions, as discussed above with respect to the gap 230A. For example, the gap 230B can evenly space the protrusion 234B and the ceramic body 101 from one another, or the gap 230B can have a tapered or other cross-sectional shape that results in non-uniform spacing between the protrusion 234B and the ceramic body 101. Further shown in FIG. 2B is a side gap 170 formed as a vertical space between the ceramic body 101 and the eyelet member 105. The side gap 170 can further allow for the expansion of the eyelet member 105 without damaging the ceramic body 101. In some embodiments, a distance between the ceramic body 101 and the eyelet member 105, i.e., a width of the side gap 170, is about 1 μm or more, such as about 5 μm or more, 10 μm or more, 20 μm or more, 50 μm or more, 100 μm or more, 150 μm or more, 200 μm or more, 300 μm or more, 400 μm or more, or 500 μm or more.

FIG. 2C shows the ceramic body 101, the eyelet member 105, and a protrusion 234C disposed in a recess 228C of the ceramic body 101. A portion of the rod member 104 is also shown in FIG. 2C for reference. The protrusion 234C includes a tip 164, a first portion 166, and a second portion 168. The first portion 166 is shown to have a circular or elliptical cross-section and the second portion 168 is shown to have a polygonal cross section. The first portion 166 of the protrusion 234C is in direct contact with the ceramic body 101. The second portion 168 of the protrusion 234C is spaced away from (not in contact with) the ceramic body 101 via a gap 230C. While the gap 230C is shown as uniform in distance between the protrusion 234C and the recess 228C, it is contemplated that the gap 230B can have various dimensions, as discussed above with respect to the gaps 230A and 230B. The gaps, such as gaps 230A-230C, formed at the protrusion-recess interface of the ceramic body 101 and the eyelet member 105 can be used for accommodating the differences in material properties to preserve the integrity of the substrate support during high temperature operation of the substrate support.

Figure 3C:
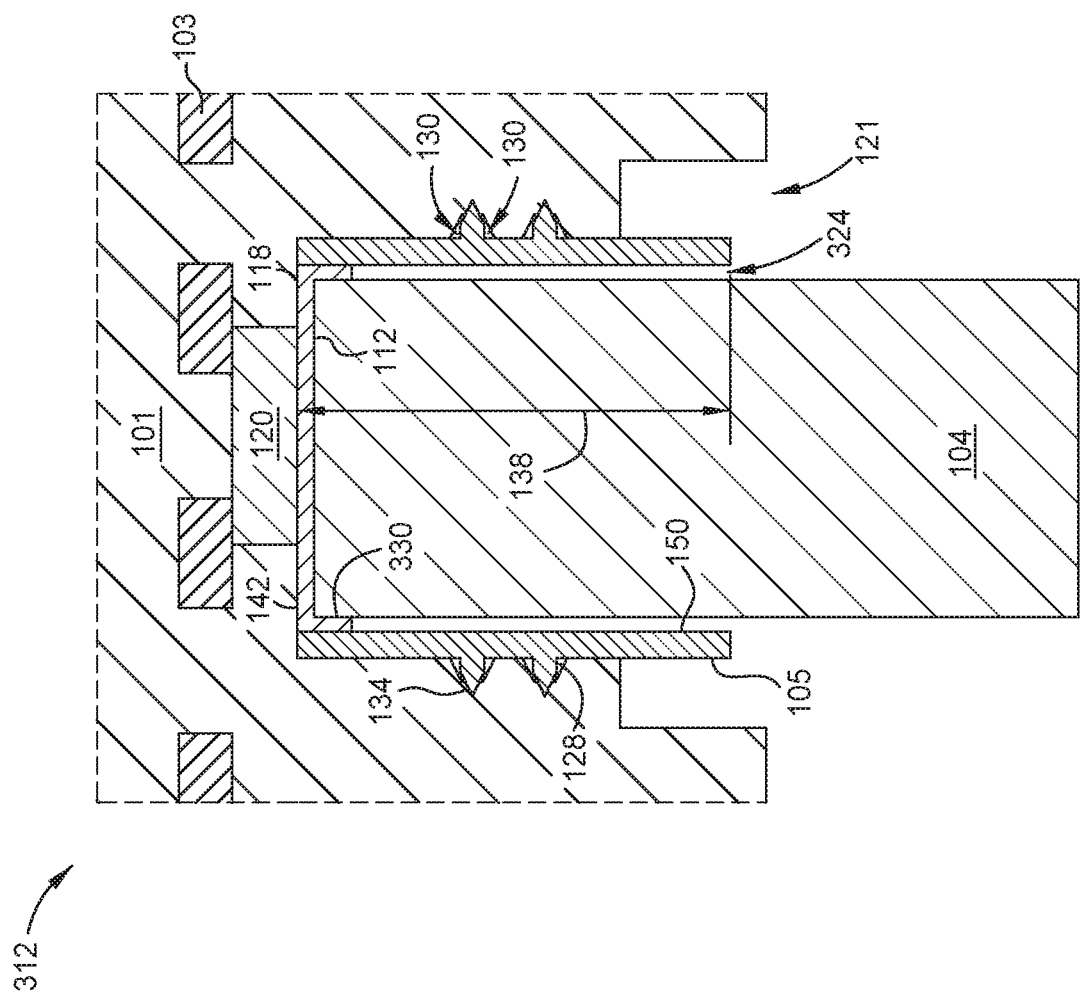

FIGS. 3A-3C are cross-sectional views of substrate supports according to embodiments of the present disclosure. The configurations of brazing material shown in FIGS. 3A-3C can be used in substrate supports having electrodes configured to be used with either AC or RF power, as well as any other substrate support where a reliable electrical connection with an embedded electrode is desired. The substrate supports 302, 310, and 312 shown in FIGS. 3A-3C, respectively, are similar to the substrate support 100 in FIGS. 1A-1B. Each of the substrate supports 302, 310, and 312 has a rod member 104 secured to a ceramic body 101 via an eyelet member 105 and a first brazing material portion 118. In FIG. 3A, the substrate support 302 further includes a metal member 314 disposed between the rod member 104 and the terminal member 120. The metal member 314 can be formed from one or more of iron (Fe), nickel (Ni), or cobalt (Co), or alloys or combinations thereof. The metal member 314 is secured to the ceramic body 101 using the first brazing material portion 118 which is disposed in between a upper surface 318 of the metal member 314 and a base 142 of the at least one aperture 121. In some embodiments, the terminal member 120 is formed in the same sintering process as the ceramic body 101 by inserting a metal plug, e.g., a molybdenum plug into an opening formed in the pre-sintered ceramic. Thus the resulting aperture 121, formed in the ceramic body 101 will comprise ceramic sidewalls and a base 142. The base 142 comprises a surface of the terminal member 120 and, in some embodiments, surface(s) of the ceramic body 101 adjacent thereto.

In one example, the metal member 314 has a coefficient of thermal expansion that is in between the coefficient of thermal expansion between the ceramic body 101 and the metal components including the rod member 104 and the eyelet member 105 to allow for improved thermal expansion matching between ceramic and metal components at high temperatures. The metal member 314 can be formed from a material that is similar or substantially similar to the material from which the rod member 104, and/or the eyelet member 105 are formed such that the metal components (e.g., the rod member 104, the eyelet 105, and the metal member 314) of the substrate support 302 have similar material properties such as the coefficients of thermal expansion. In some embodiments, a difference between any two of the coefficients of thermal expansion of the materials used for the metal components, (e.g., the rod member 104, the eyelet 105, and the metal member 314) is 20% or less, such as 15% or less, 10% or less, or 5% or less, or 3% or less, or 1% or less.

Further as shown in FIG. 3A, the substrate support 302 includes first "overhang" portion 304 of brazing material extending down a portion of an outward facing surface the metal member 314 and thus disposed between the metal member 314 and the eyelet member 105. As discussed herein, an "overhang" portion of brazing material is a portion that wraps around a corner of a component, such as around the edge portions of the upper surface (end) of the metal member 314. In one example, the overhang portion may couple and/or contact multiple components of the substrate support 302. In this example, the first overhang portion 304 couples the metal member 314 to each of the terminal member 120 and the eyelet member 105.

The substrate support 302 can include a second brazing material portion 308 that extends horizontally between an upper surface 112 (first end) of the rod member 104 and a bottom surface 320 (second end) of the metal member 314. The second brazing material portion 308 secures the rod member 104 to the metal member 314. A second overhang portion 306 of brazing material extends upwards from the second brazing material portion 308 along the sidewall 316 of the metal member 314. The second overhang portion 306 of brazing material secures the metal member 314 to the rod member 104. The second overhang portion 306 further secures the metal member 314 to the eyelet member 105. The first overhang portion 304 is separated from the second overhang portion 306 by a gap 322 such that the first overhang portion 304 and the second overhang portion 306 are spaced from one another. The gap 322 enables the expansion of at least the metal member 314 and the eyelet member 105 during operation of the process chamber in which the substrate support 302 is disposed.

FIG. 3B shows the substrate support 310 which is similar to the substrate support 100 as discussed above. A second brazing material portion 326 in FIG. 3B extends for a length 328 from the first brazing material portion 118 along the circumferential surface of the rod member 104. However, in contrast to the substrate support 100 where length 122 of the second brazing material portion 116 of brazing material is within +/−10% of the eyelet length 138, the length 328 of the second brazing material portion 326 in FIG. 3B extends along less than 20% of the length 138 of the eyelet member 105. In another example, the second brazing material portion 326 extends along the outward facing (circumferential) surface of the rod member 104 for a length 328 such that the brazing material does not contact the plurality of protrusions 134. A vertical gap 324 is formed between the circumferential surface of the rod member 104 and the inward facing surface 150 of the eyelet member 105. The vertical gap 324 enables the expansion of the rod member 104 and the eyelet member 105 at elevated operation temperatures which prevents damage to the ceramic body 101.

FIG. 3C shows the substrate support 312 which is similar to the substrate support 310 as discussed above. Here, the second brazing material portion 330 is an overhang portion that extends from the first brazing material portion 118 of brazing material along the circumferential surface of the rod member 104. However, in contrast to the substrate support 100 where length 122 of the second brazing material portion 116 is within +/−10% of the eyelet length 138, the second brazing material portion 330 in FIG. 3C extends along less than 5% of the length 138 of the eyelet member 105. The second brazing material portion 330 secures the rod member 104 to the eyelet member 105 and the base 142 of the at least one aperture 121 of the ceramic body 101. In one example, the second brazing material portion 330 is not in contact with the plurality of protrusions 134.

Accordingly, the substrate supports discussed herein accommodate the material property differences between the ceramic body and the metal components including the rod member and the eyelet member that can cause the metal components and ceramic body to expand and contract at different rates. The gaps formed between the protrusions of the eyelet member and the recesses of the ceramic body allow the eyelet member to expand when the substrate support is at elevated temperatures on the order of about 650° C. without damaging the ceramic body. Similarly, one or more gaps can be formed vertically between the respective sidewalls of the eyelet member and the rod member and/or between the sidewall of the eyelet member and the outside surface of the ceramic body. The vertical gap(s) further compensate for the difference in material properties between components of the substrate support by providing a space in which the eyelet member and the rod member can expand and contract without damaging the ceramic body.

While the foregoing is directed to embodiments of the present disclosure, other and further embodiments of the disclosure may be devised without departing from the basic scope thereof, and the scope thereof is determined by the claims that follow.

What is claimed is:

1. A substrate support, comprising:
a ceramic body having an electrode embedded therein;
a rod member at least partially disposed in an aperture formed in the ceramic body, wherein the aperture is defined by one or more sidewalls having a plurality of recesses formed therein; and
an eyelet member circumferentially disposed about the rod member, the eyelet member having a plurality of protrusions extending outwardly therefrom, wherein
each protrusion of the plurality of protrusions is disposed in a corresponding recess of the plurality of recesses, and
a first portion of each protrusion of the plurality of protrusions is in contact with the ceramic body and a second portion of each protrusion is separated from the ceramic body by a gap disposed there between.

2. The substrate support of claim 1, wherein the eyelet member is formed from a metal.

3. The substrate support of claim 1, wherein the eyelet member is formed from a metallic foam.

4. The substrate support of claim 1, further comprising:
a terminal member disposed between an end of the rod member and a base of the aperture; and
a first portion of a brazing material electrically coupling the rod member to the terminal member.

5. The substrate support of claim 4, further comprising a heating element dispose in the ceramic body.

6. The substrate support of claim 4, wherein the terminal member is in electrical communication with the electrode.

7. The substrate support of claim 4, further comprising a second portion of the brazing material extending from the first portion of the brazing material along at least a portion of a circumferential surface of the rod member.

8. The substrate support of claim 7, wherein a length of the rod member along which the second portion of the brazing material is disposed is less than an overall height of the eyelet member.

9. The substrate support of claim 7, wherein a length of the rod member along which the second portion of the brazing material is disposed is substantially the same as the overall height of the eyelet member.

10. The substrate support of claim 1, wherein one or both of the rod member and the eyelet member are formed from nickel or an alloy thereof.

11. A substrate support, comprising:
a ceramic body having an aperture formed therein, the aperture defined by a sidewall having a plurality of recesses formed therein;
a rod member disposed in the aperture;
an eyelet member circumferentially disposed around the rod member, the eyelet member being formed from a metal foam and having a plurality of protrusions extending outward therefrom, wherein
each protrusion of the plurality of protrusions is disposed in a corresponding recess of the plurality of recesses,
a first portion of each protrusion of the plurality of protrusions is in contact with a first portion of the respective recess of the ceramic body, and
a second portion of each protrusion is spaced apart from a second portion of the respective recess by a gap disposed therebetween; and
a brazing material disposed in between a base of the aperture and an end of the rod member.

12. The substrate support of claim 11, further comprising a terminal member disposed in the base of the aperture, wherein the brazing material is in contact with the terminal member.

13. The substrate support of claim 12, further comprising a heating element dispose in the ceramic body.

14. The substrate support of claim 12, wherein the terminal member is in electrical communication with an electrode embedded in the ceramic body of the substrate support.

15. The substrate support of claim 11, wherein the rod member and the eyelet member are formed from nickel or an alloy thereof.

16. A substrate support, comprising:
a ceramic body having an aperture formed therein, the aperture defined by a sidewall having a plurality of recesses formed therein;
a rod member disposed in the aperture;
an eyelet member circumferentially disposed about the rod member, the eyelet member having a plurality of protrusions extending radially outward therefrom, wherein
each protrusion of the plurality of protrusions is disposed in a corresponding recess of the plurality of recesses,
a first portion of each protrusion of the plurality of protrusions is in contact with a first portion of a surface of the respective recess, and
a second portion of each protrusion is spaced apart from a second portion of a surface of the respective recess to define a gap there between;
a first portion of a brazing material is disposed in between a base of the aperture and an end of the rod member; and
a second portion of the brazing material extends from the first portion of the brazing material along at least a portion of the circumferential surface of the rod member.

17. The substrate support of claim 16, wherein the eyelet member is formed of a metallic foam.

18. The substrate support of claim 16, further comprising a terminal member disposed at the base of the aperture between the end of the rod member and an electrode embedded in the ceramic body, wherein the first portion of brazing material is in contact with the terminal member.

19. The substrate support of claim 16, wherein a length of a portion of the rod member along which the second portion of the brazing material is disposed is less than an overall height of the eyelet member.

20. The substrate support of claim 16, wherein a length of a portion of the rod member along which the second portion of the brazing material is disposed is substantially the same as an overall height of the eyelet member.

* * * * *